United States Patent
Fan et al.

(10) Patent No.: US 8,498,119 B2
(45) Date of Patent: Jul. 30, 2013

(54) ELECTRONIC DEVICE ACCESS DOOR

(75) Inventors: Chen-Lu Fan, Tu-Cheng (TW); Jing-Chao Liang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 265 days.

(21) Appl. No.: 13/159,573

(22) Filed: Jun. 14, 2011

(65) Prior Publication Data

US 2012/0106090 A1 May 3, 2012

(30) Foreign Application Priority Data

Nov. 2, 2010 (CN) .......................... 2010 1 0528315

(51) Int. Cl.
*H05K 5/00* (2006.01)
(52) U.S. Cl.
USPC ........................................................ 361/724
(58) Field of Classification Search
USPC ........................................................ 361/724
See application file for complete search history.

(56) References Cited

U.S. PATENT DOCUMENTS

| | | | |
|---|---|---|---|
| 2,188,703 A * | 1/1940 | Burke | 70/82 |
| 5,684,671 A * | 11/1997 | Hobbs et al. | 361/679.57 |
| 7,425,678 B2 * | 9/2008 | Adducci et al. | 174/50 |
| 7,795,532 B2 * | 9/2010 | Walker | 174/50 |
| 8,395,883 B2 * | 3/2013 | Takata et al. | 361/641 |
| 2001/0046122 A1 * | 11/2001 | Nygard | 361/726 |
| 2003/0161113 A1 * | 8/2003 | Wrycraft et al. | 361/724 |
| 2005/0047097 A1 * | 3/2005 | Johnson et al. | 361/725 |
| 2008/0093101 A1 * | 4/2008 | Kessler et al. | 174/58 |
| 2008/0165486 A1 * | 7/2008 | Chen et al. | 361/683 |
| 2008/0225475 A1 * | 9/2008 | Zhang et al. | 361/683 |
| 2010/0208433 A1 * | 8/2010 | Heimann et al. | 361/724 |
| 2010/0244641 A1 * | 9/2010 | Bergesch et al. | 312/326 |
| 2011/0019365 A1 * | 1/2011 | Souligne | 361/724 |
| 2011/0291852 A1 * | 12/2011 | Forristal et al. | 340/686.1 |

* cited by examiner

*Primary Examiner* — Lisa Lea Edmonds
(74) *Attorney, Agent, or Firm* — Altis Law Group, Inc.

(57) ABSTRACT

An electronic device includes a chassis, a rotatable door, and a latch member. An opening is defined in the chassis. A first flange extends from an edge of the opening. A first mounting slot is defined in the first flange. The rotatable door is rotatable between a closed position and an open position. The rotatable door includes a second flange with a second mounting slot defined therein. The latch module includes a latch piece with a mounting hole defined therein and a slidable pin securely engaged in the mounting hole. The latch piece is movable between a locked position where the latch piece is engaged into the first mounting slot and the second mounting slot, and an unlocked position where the latch piece is disengaged from the first mounting slot and the second mounting slot.

20 Claims, 4 Drawing Sheets

ELECTRONIC DEVICE ACCESS DOOR

BACKGROUND

1. Technical Field

The present disclosure relates to an electronic device with a rotatable door that facilitates access to components installed in the electronic device.

2. Description of Related Art

Large electronic devices usually include a chassis and a rotatable door or window attached to the chassis, for which an opening is defined in the chassis. When closed, the rotatable door seals the opening, and exposes the opening when rotated open, for accessing components in the chassis. After the rotatable door is closed the rotatable door is secured by a spring pin fastener. To open the rotatable door, the spring pin fastener must be pulled back, however, the spring pin fastener does not operate in a user-friendly fashion, and the spring pin fastener is easily worn out by repeated use.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean at least one.

Figure 1:
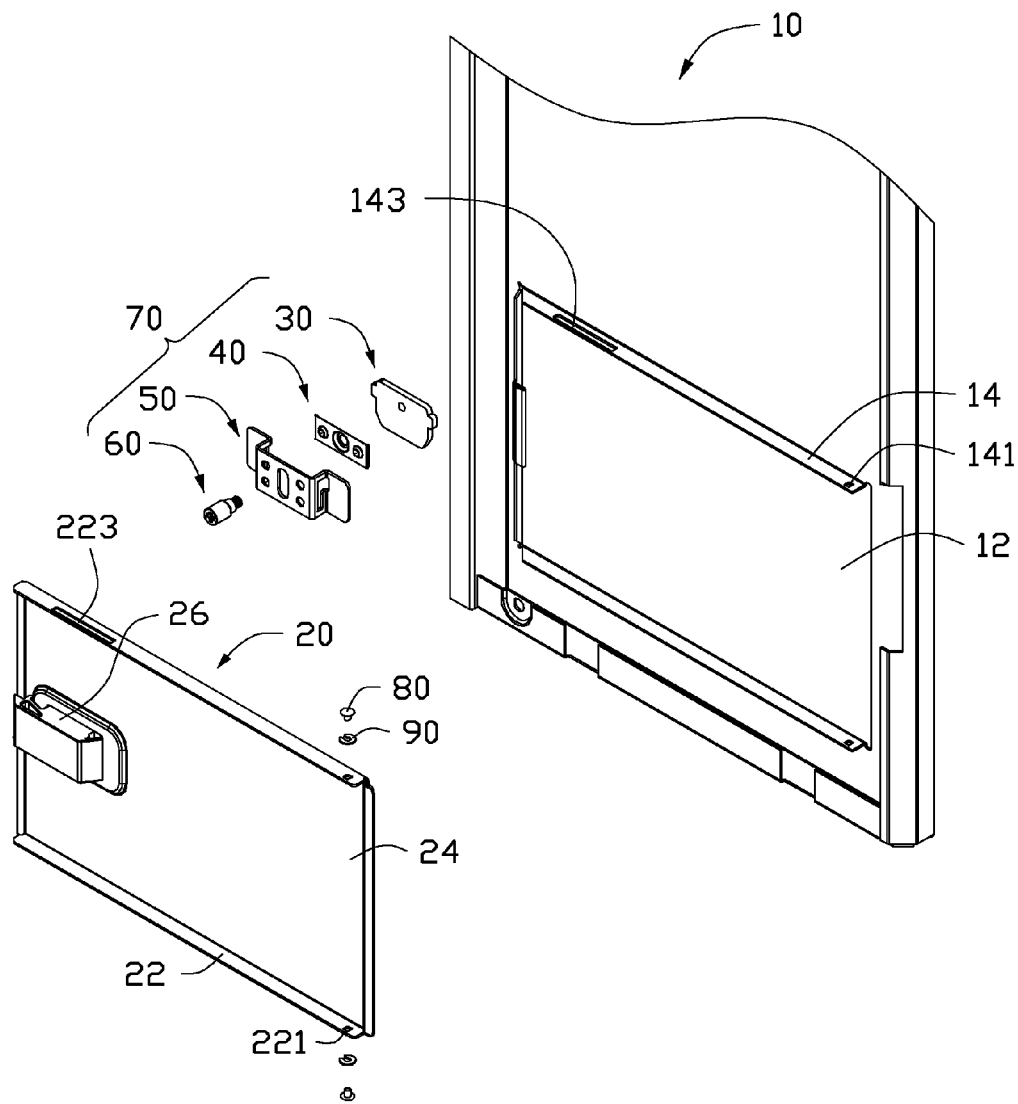
FIG. 1 is an exploded view of part of the chassis of an electronic device according to an embodiment.

Referring to FIG. 1, an embodiment of an electronic device includes a side panel 10, a rotatable door 20, a latch module 70, a pair of pivot posts 80, and a pair of washers 90 with an incomplete ring shape. In one embodiment, the electronic device is a computer, a server etc. The side panel 10 is a part of a chassis of the electronic device.

An opening 12 is defined in the side panel 10. A pair of first flanges 14 is bent from the upper and lower edges of the opening 12. A first pivot hole 141 is defined in each of the pair of first flanges 14. A first mounting slot 143 is defined in the upper one of the pair of first flanges 14.

The rotatable door 20 includes a main plate 24 and a pair of second flanges 22 bent from the upper and lower edges of the main plate 24. The rotatable door 20 is substantially the same size as the opening 12. A second pivot hole 221 is defined in each of the pair of second flanges 22. A second mounting slot 223 is defined in one of the pair of second flanges 22. A handle 26 is attached to the main plate 24 and located below the second mounting slot 223. The second pivot hole 221 and the second mounting slot 223 are located at opposite ends of the rotatable door 20.

Figure 2:
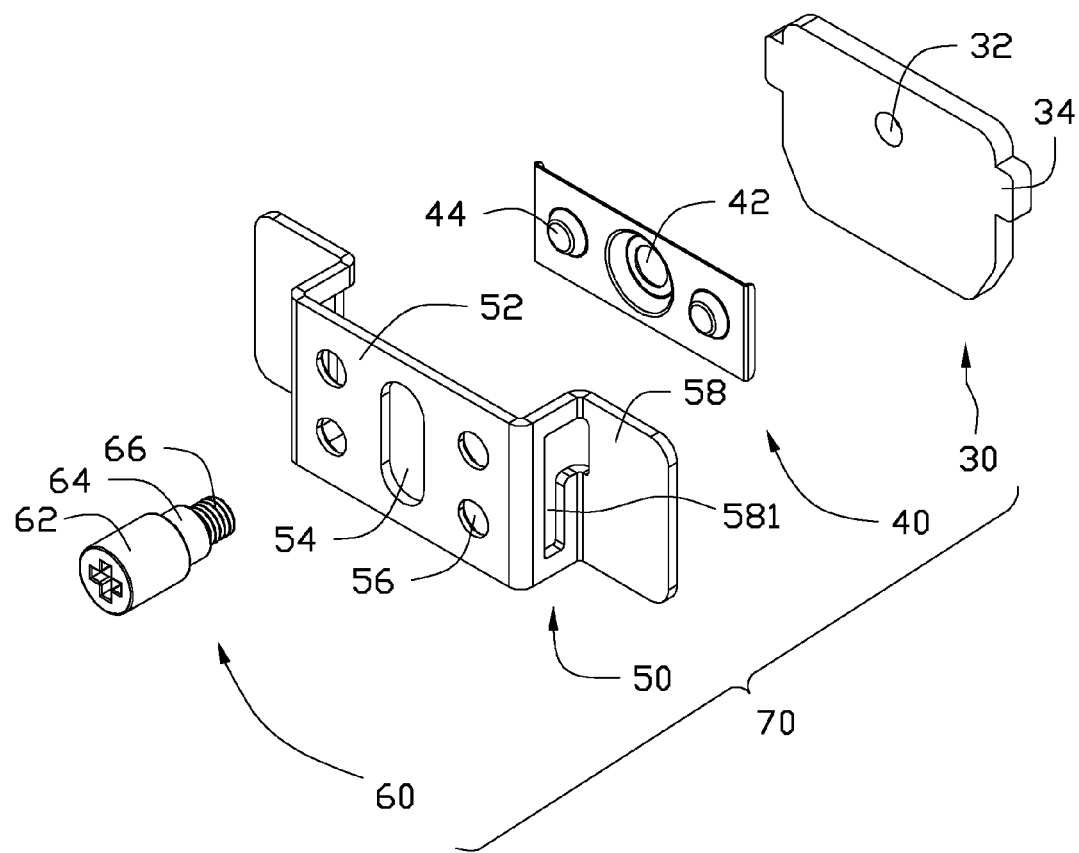
FIG. 2 is an enlarged view of a latch module of FIG. 1.

Referring to FIG. 2, the latch module 70 includes a latch piece 30, a damping piece 40, a holder 50, and a slidable pin 60. A mounting hole 32 is defined in the latch piece 30. A mounting aperture 42 is defined in the central portion of the damping piece 40. A pair of protrusions 44 protrudes from the damping piece 40 and the mounting aperture 42 is located between the pair of protrusions 44. The holder 50 includes a mounting piece 52 and a pair of symmetrical side flanges 58. The side flanges 58 are L-shaped. A vertical slot 54 is defined in the central portion of the mounting piece 52. Two pairs of engaging holes 56 are defined in the mounting piece 52 and are located on either side of the vertical slot 54. An L-shaped slot 581 is defined in each of the pair of side flanges 58. A pair of tabs 34 protrudes from opposite sides of the latch piece 30. The pair of tabs 34 is slidable along the L-shaped slots 581. The slidable pin 60 includes a head 62, a connection portion 64, and a threaded end 66. The connection portion 64 is connected between the head 62 and the threaded end 66. The diameter of the connection portion 64 is less than that of the head 62. The diameter of the threaded end 66 is less than that of the connection portion 64. The diameter of the head 62 is slightly greater than the width of the vertical slot 54. The diameter of the connection portion 64 is less than the width of the vertical slot 54. The threaded end 66 can be securely engaged through the mounting aperture 42 and into the mounting hole 32.

Figure 3:
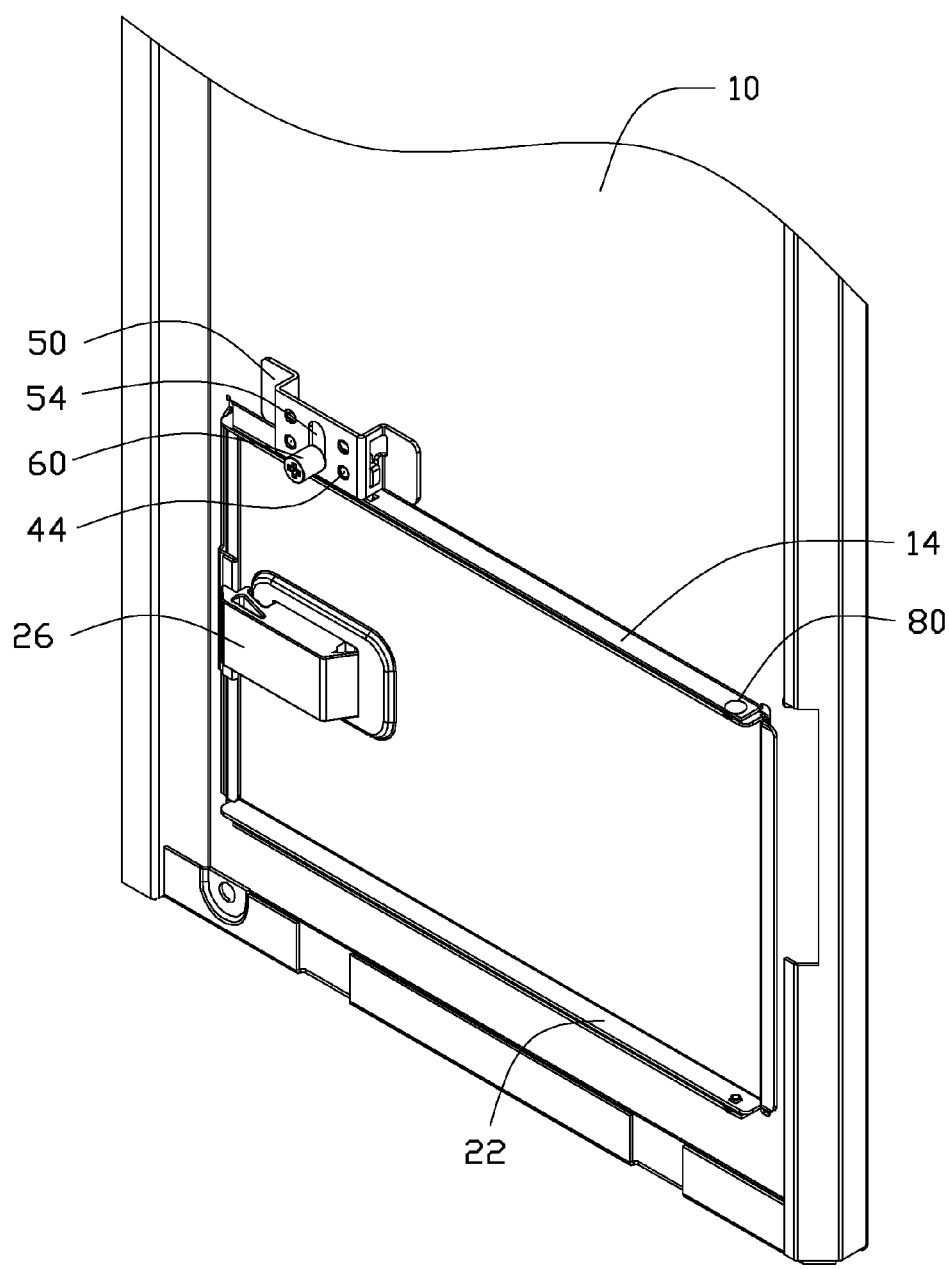
FIG. 3 is an assembled view of the components of FIG. 1.
Figure 4:
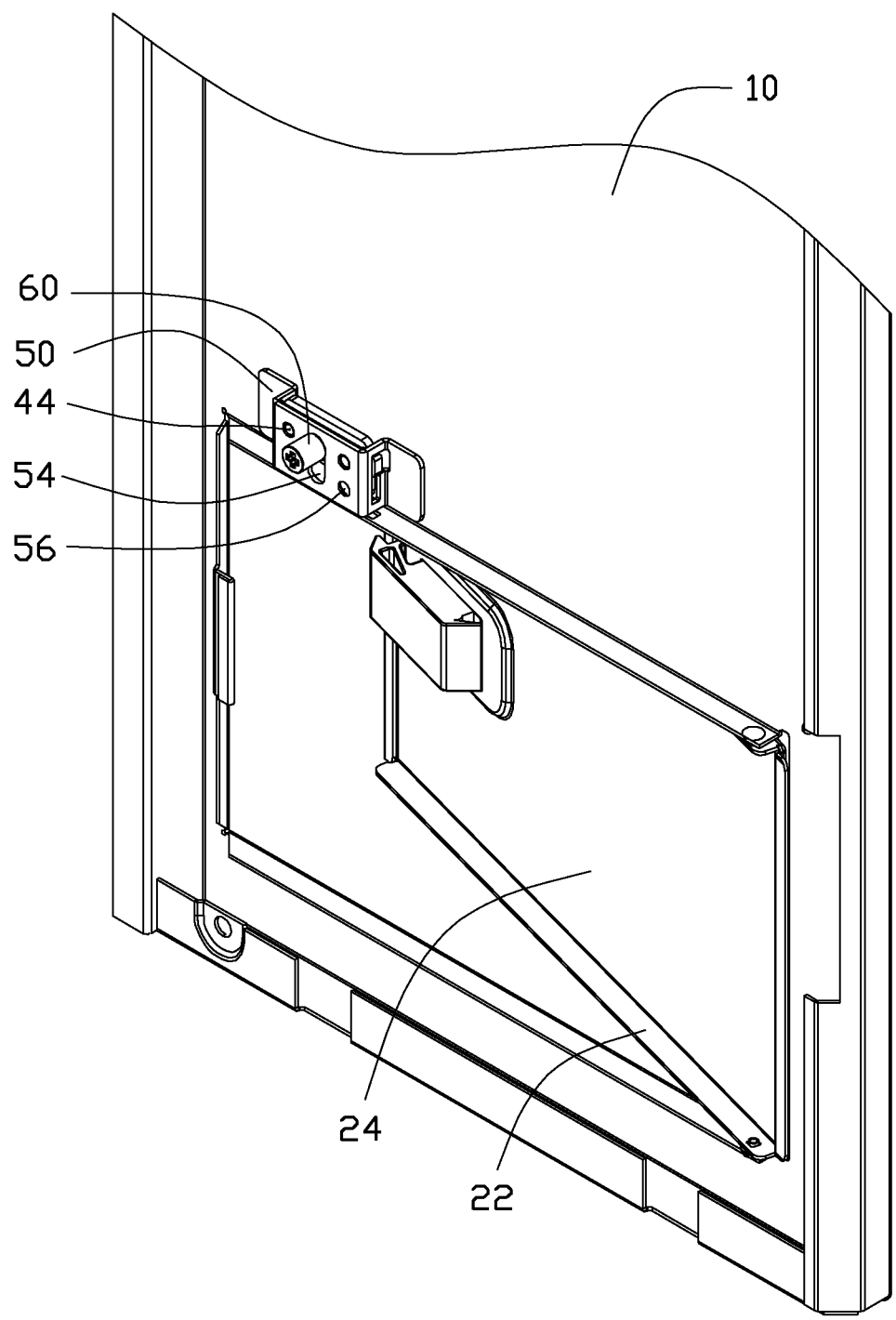
FIG. 4 is similar to FIG. 3, but showing a rotatable door of FIG. 3 in an open state.

Referring to FIGS. 3 and 4, in assembly, the rotatable door 20 is aligned with the opening 12. The pair of second pivot holes 221 is aligned with the pair of first pivot holes 141. The pair of pivot posts 80 extends into the pair of first pivot holes 141, through the holes of the washers 90, and into the pair of second pivot posts 221. Thereby, the rotatable door 20 is pivotably attached to side panel 10. The pair of protrusions 44 is engaged into the two upper engaging holes 56 to secure the damping piece 40 to the concave side of the holder 50. The pair of tabs 34 is received in the upper portions of the pair of L-shaped slots 581 and are movable along the pair of L-shaped slots 581. The mounting hole 32 is aligned with the mounting aperture 42. The threaded end 66 extends through the vertical slot 54 and is securely engaged through the mounting aperture 42 and into the mounting hole 32, thereby securing the latch piece 30 against the rear side of the damping piece 40. The holder 50 is secured to the side panel 10 and located above the first mounting slot 143. The latch piece 30 is aligned with the first mounting slot 143.

To lock the rotatable door 20 (see FIG. 3), it is closed to the point where the first mounting slot 143 is aligned with the second mounting slot 223. The user can push the slidable pin 60 downwards along the vertical slot 54. The damping piece 40 and the latch piece 30 slide downwards together with the slidable pin 60. The pair of protrusions 44 engages into the two lower engaging holes 56. The pair of tabs 34 slides along the L-shaped slots 581 until reaching the bottom of the L-shaped slots 581. The latch piece 30 extends through the first mounting slot 143 and into the second mounting slot 223. Thus, the rotatable door 20 is locked by the latch module 70.

To open the rotatable door 20 (see FIG. 4), the user can push the slidable pin 60 upwards along the vertical slot 54. The damping piece 40 and latch piece 30 slide upwards together with the slidable pin 60 until reaching a position where the pair of protrusions 44 engages into the two upper engaging holes 56 and the latch piece 30 disengages from the second mounting slot 223 and the first mounting slot 143. Then the rotatable door 20 will have been released and can be rotated to an open position where the opening 12 is exposed for facilitating a user's access to components inside the chassis.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. An electronic device comprising:
   a chassis with an opening defined therein;
   a rotatable door, attached to the chassis, rotatable between a closed position, where the opening is closed, and an open position, where the opening is exposed; and
   a latch module comprising a latch piece, a holder securely attached to the chassis, and a slidable pin; a sliding slot being defined in the holder; a mounting hole being defined in the latch piece; the latch piece is located between the holder and the chassis; the slidable pin is slidably engaged in the sliding slot and securely engaged in the mounting hole;
   wherein the latch piece is movable together with the slidable pin between a first position where the rotatable door is locked by the latch piece, and a second position where the rotatable door is released by the latch piece.

2. The electronic device of claim 1, wherein a pair of first flanges extends from a pair of opposite edges of the opening, and the rotatable door is pivotably attached to the pair of first flanges.

3. The electronic device of claim 2, wherein the rotatable door comprises a main plate and a pair of second flanges extended from a second pair of opposite edges of the main plate, a first pivot hole is defined in each of the pair of first flanges, a second pivot hole is defined in each of the pair of second flanges, and a pair pivot posts is engaged in the first pivot hole and the second pivot hole to pivotably attach the rotatable door to the chassis.

4. The electronic device of claim 3, wherein a first mounting slot is defined in one of the pair of first flanges, a second mounting slot is defined in one of the pair of second flanges, and the latch piece is engaged in the first mounting slot and the second mounting slot to lock the rotatable door in the first position.

5. The electronic device of claim 1, wherein the latch module further comprises a damping piece located between the holder and the latch piece.

6. The electronic device of claim 5, wherein the holder comprises a mounting piece and a pair of L-shaped side flanges extending from opposite sides of the mounting piece, the pair of L-shaped side flanges is secured to the chassis, and the damping piece is secured to the mounting piece.

7. The electronic device of claim 6, wherein the sliding slot is defined in the mounting piece, a first engaging hole and a second engaging hole is defined in the mounting piece besides the sliding slot, at least one bump protrudes from the damping piece, the at least one bump is engaged in the first engaging hole in the first position and engaged in the second engaging hole in the second position.

8. The electronic device of claim 7, wherein a mounting aperture is defined in the damping piece, the slidable pin is securely engaged in the mounting aperture and the mounting hole.

9. The electronic device of claim 8, wherein the slidable pin includes a head, a connection portion, and a threaded end; and the connection portion is slidably engaged in the sliding slot, the threaded end is securely engaged in the mounting aperture and the mounting hole.

10. The electronic device of claim 9, wherein a diameter of the head is greater than a width of the sliding slot, a diameter of the connection portion is not greater than the width of the sliding slot, and a diameter of the threaded end is less than that of the connection portion.

11. An electronic device comprising:
    a chassis with an opening defined therein, at least one first flange extending from an edge of the opening, and a first mounting slot being defined in the at least one first flange;
    a rotatable door rotatable between a closed position, where the opening is closed, and an open position, where the opening is exposed, comprising at least one second flange with a second mounting slot defined therein; and
    a latch module comprising a latch piece, with a mounting hole defined therein, and a slidable pin securely engaged in the mounting hole;
    wherein the latch piece is movable together with the slidable pin between a lock position, where the latch piece is engaged into the first mounting slot and the second mounting slot, and an unlock position, where the latch piece is disengaged from the first mounting slot and the second mounting slot.

12. The electronic device of claim 11, wherein the latch module further comprises a holder securely attached to the chassis, a sliding slot is defined in the holder, and the slidable pin is slidably engaged in the sliding slot.

13. The electronic device of claim 11, wherein a first pivot hole is defined in the at least one first flange, a second pivot hole is defined in the at least one second flange, and a pivot post is engaged in the first pivot hole and the second pivot hole to pivotably attach the rotatable door to the chassis.

14. The electronic device of claim 12, wherein the latch module further comprises a damping piece located between the holder and the latch piece.

15. The electronic device of claim 14, wherein the holder comprises a mounting piece and a pair of L-shaped side flanges extending from opposite sides of the mounting piece, the pair of L-shaped side flanges is secured to the chassis, and the damping piece is secured to the mounting piece.

16. The electronic device of claim 15, wherein the sliding slot is defined in the mounting piece, a first engaging hole and a second engaging hole is defined in the mounting piece besides the sliding slot, at least one bump protrudes from the damping piece, the at least one bump is engaged in the first engaging hole in the lock position and engaged in the second engaging hole in the unlock position.

17. The electronic device of claim 16, wherein a mounting aperture is defined in the damping piece, the slidable pin is securely engaged in the mounting aperture and the mounting hole.

18. The electronic device of claim 17, wherein the slidable pin includes a head, a connection portion, and a threaded end; the connection portion is slidably engaged in the sliding slot, and the threaded end is securely engaged in the mounting aperture and the mounting hole.

19. The electronic device of claim 18, wherein a diameter of the head is greater than a width of the sliding slot, a diameter of the connection portion is not greater than the width of the sliding slot, and a diameter of the threaded end is less than that of the connection portion.

20. The electronic device of claim 11, where the rotatable door comprises a handle located below the first mounting slot.

\* \* \* \* \*